United States Patent
LaPalme et al.

(10) Patent No.: US 9,401,551 B2
(45) Date of Patent: Jul. 26, 2016

(54) REVERSE TAPER, ANTI-PULL OUT SUPPORT FEATURE FOR SURFACE MOUNT HDMI AND USB CONNECTORS

(71) Applicant: EchoStar Technologies L.L.C., Englewood, CO (US)

(72) Inventors: Jerome A. LaPalme, Aurora, CO (US); Jeffrey L. Mailloux, Monument, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 43 days.

(21) Appl. No.: 14/477,585

(22) Filed: Sep. 4, 2014

(65) Prior Publication Data

US 2016/0072206 A1    Mar. 10, 2016

(51) Int. Cl.
*H01R 12/00*    (2006.01)
*H05K 1/00*    (2006.01)
*H01R 12/58*    (2011.01)
*H05K 1/11*    (2006.01)

(52) U.S. Cl.
CPC ............... *H01R 12/58* (2013.01); *H05K 1/115* (2013.01)

(58) Field of Classification Search
CPC .......... H01R 12/58; H05K 1/115; H05K 1/11
USPC ................ 439/79–83, 660, 92, 527
See application file for complete search history.

(56) References Cited

U.S. PATENT DOCUMENTS

| 2009/0042421 A1* | 2/2009 | Zheng | H01R 23/6873 439/83 |
| 2014/0011378 A1* | 1/2014 | Lan | H01R 12/51 439/83 |

OTHER PUBLICATIONS

"Micro HDMI, Type-D 0.4 MM Pitch, 19CKT Receptacle Connector," Data Sheet, *Molex Incorporated*, Document No. SD-46765-001, First Version Oct. 14, 2008, Public Release Jan. 10, 2013, EC No. S2013-0441, 5 pages.

\* cited by examiner

*Primary Examiner* — Javaid Nasri
(74) *Attorney, Agent, or Firm* — Seed IP Law Group PLLC (57) ABSTRACT

A reverse tapered mounting tab for a signal connector is disclosed. The signal connector includes the reverse tapered mounting tab coupled to a connector body having a connector port inside. The reverse tapered mounting tab is configured to be secured in a through hole of a circuit board. Solder may be positioned in the through hole after positioning the mounting tab. The solder may prevent the mechanical tab from being forced through the through hole even after minor cracking and deformations in the solder.

21 Claims, 6 Drawing Sheets

REVERSE TAPER, ANTI-PULL OUT SUPPORT FEATURE FOR SURFACE MOUNT HDMI AND USB CONNECTORS

BACKGROUND

1. Technical Field

Embodiments of the disclosure are directed to securing a signal connector to a circuit board and, in particular, to increasing the durability of a soldered connection between a tab of the signal connector and a through hole in the circuit board.

2. Description of the Related Art

In computing devices, such as personal computers, there are a number of ports that a user can access. These ports provide functionality to additional devices that communicate with the computing device, such as printers, webcams, music players, TVs, satellite set top boxes, and much more. The wear on these ports is greater when the users are coupling lines to and decoupling lines from the port. Wear is also increased by strain on the mechanical connector caused by the coupled line being in tension or compression.

Heat may also increase the wear as the connector may experience weakening from fatigue or may fail because of repeated thermal expansion and contraction cycles. As heat increases, the volume of matter tends to increase. Because there are different materials coupled together, their rates of expansion will vary. As heat cycles occur in the system, either as a result of normal operation, or from power cycling of the system, the different materials will expand and contract according to their coefficient of thermal expansion. Furthermore, larger areas will experience a greater overall expansion than smaller areas, so different sized pieces will not expand uniformly. The heat may be generated by the circuit board, the signal connector, or both.

Other factors may also increase the failure rate of the signal connectors as well. The effects of these factors are amplified when using surface mount signal connectors in which the connector uses through mount tabs for coupling and/or securing the connector to a circuit board and surface mount connectors for electrically coupling the signal lines to the circuit board. Many of these ports are viewed as system critical ports and a failure of the connector requires the system to be scrapped. This leads to user dissatisfaction and increased manufacturer warranty costs.

Figure 1:
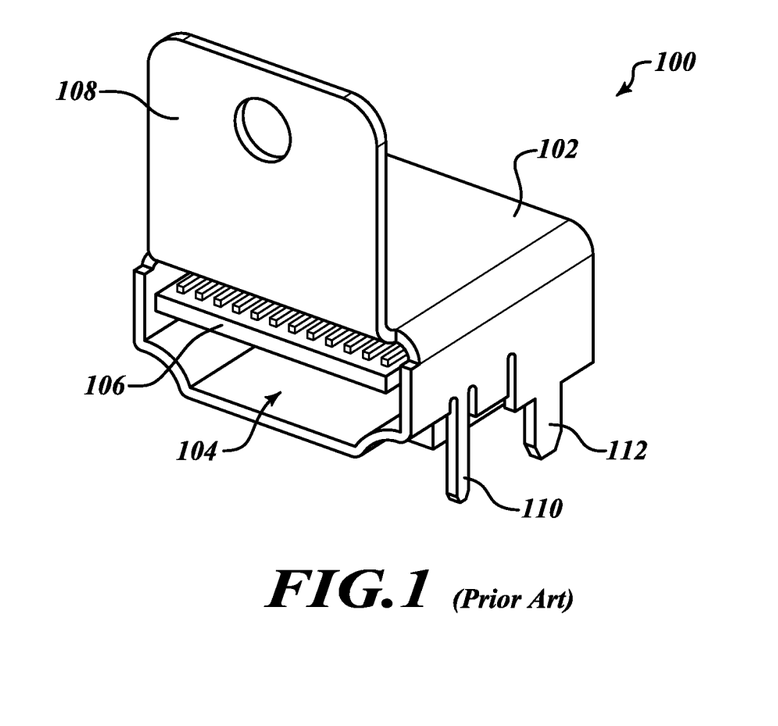
FIG. 1 is an isometric view of an HDMI panel flange signal connector, according to the prior art.

FIG. 1 is an isometric view of an HDMI panel flange signal connector according to the prior art. The signal connector 100 includes a connector body 102 having an opening 104. The opening 104 exposes a port connector 106 housed inside the connector body 102. A panel flange 108 extends from the connector body 102 on a top side of the connector body 102. A first mounting tab 112 and a second mounting tab 110 extend from the connector body 102 on a bottom side of the connector body 102. The first and second mounting tabs 112, 110 are straight tabs with uniform widths over the entire length of the each tab.

The port connector 106 will have a number of individual surface contact lines that extend from the under surface of the connector body, which cannot be seen in this view. These signal pads are coupled with a surface mount connection to a circuit board.

The first and second mounting tabs 112, 110 are typically coupled to the circuit board using solder. There are two bonds with the solder in each connection, the first being a bond between the solder and the circuit board. The circuit board through hole is often lined with copper to increase the durability of this connection. These bonds will generally withstand up to 40 pounds in a linear shear force pull test. The second bond is the bond between the solder and the mounting tab.

The tab may be made of tin, nickel, another pure material, an alloy, or a plated material covered with any one of the previous materials. Tin provides good adhesion but poor resistance to cracking Nickel provides good resistance to cracking, but poor adhesion. An alloy or a plated material usually provides a better balance of material properties than either tin or nickel. This second solder bond, between the tab and the solder, is typically much weaker than the first bond due, in part, because of the less durable materials, but also because of a reduced surface area of the bond as compared to the through hole to solder bond.

Lead based solders generally provide a sufficiently durable connection between the circuit board and the signal connector. While lead based solder may be sufficiently durable, the industry continues to move away from lead based solder due to environmental and health concerns. Non-lead based solders suffer from a greater risk of cracking with use, reducing durability.

When the mounting tabs fail, the connector may fail either because of loss of electrical connection for the mounting tab or failure of surface contact lines. When the tabs fail they may lose good electrical connection with the circuit board. Often, the mechanical tabs are used to couple the signal connector to ground, and a loss of electrical connection means the signal connector is floating. This may result in a high current situation from charges accumulating either on the circuit board or on the signal connector. Other problems associated with an ungrounded circuit could also be present. In addition, when the tabs fail the mechanical loads on the connector may be transferred to the much weaker surface contact lines. When the surface contact lines are subject to these loads, they experience a reduced expected lifespan, leading to the whole signal connector failing earlier. A way to increase the useful life of these signal connectors is needed.

BRIEF SUMMARY

A reverse tapered mounting tab on a signal connector is disclosed that provides increased durability of the connection between the signal connector and a circuit board. Solder is positioned around the tapered mounting tab to create a compression fitting between the mounting tab and the circuit board that prevents the mounting tab from slipping out of the solder if the solder cracks or deforms.

A signal connector device according to one embodiment includes a connector body with a port connector inside the connector body, and a reverse tapered mounting tab. The reversed tapered mounting tab has three sections, a first section near the top, a second section near the middle and a third section near the bottom, the second section more narrow than the first and third sections. In a preferred embodiment the change in width between the sections is gradual, with the change in width between the third section and the second section being even more gradual than the change in width between the first section and the second section.

The signal connector with through mount tabs may have either surface mount or through mount contacts for the signal passing through the connector. The signal connector may also have a plurality of reverse tapered mounting tabs, and the plurality of reverse tapered mounting tabs may be in different sizes.

When mounted to the circuit board, the signal connector is preferably connected with the use of a solder connection coupling the reverse tapered mounting tab to a through hole of the circuit board. In one embodiment the top and bottom of the mounting tab are above and below the circuit board, respectively, and the tapered section lies within the circuit board through hole. In another embodiment, the tapered section extends beyond the through hole of the circuit board.

Also disclosed is a method for securing a signal connector to a circuit board by forming a reverse tapered mounting tab on the signal connector and soldering the reverse tapered mounting tab to the circuit board. A tapered section of the mounting tab may be completely encapsulated by the solder and the solder may extend beyond a top and bottom surface of the circuit board.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles may not be drawn to scale, and some of these elements may have been enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures and methods associated with integrated circuits and semiconductor manufacturing/packaging processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

An HDMI surface mount connector is used in the figures for illustrative purposes only and should not be construed as a limitation of the claims. The disclosure is applicable to all signal connectors, including but not limited to: HDMI, USB, displayport, serial connectors, Ethernet ports, power connectors, audio jacks, FireWire, or any other signal connector. Additionally, the disclosure relates to both surface mount and through mount signal connectors.

Figure 2:
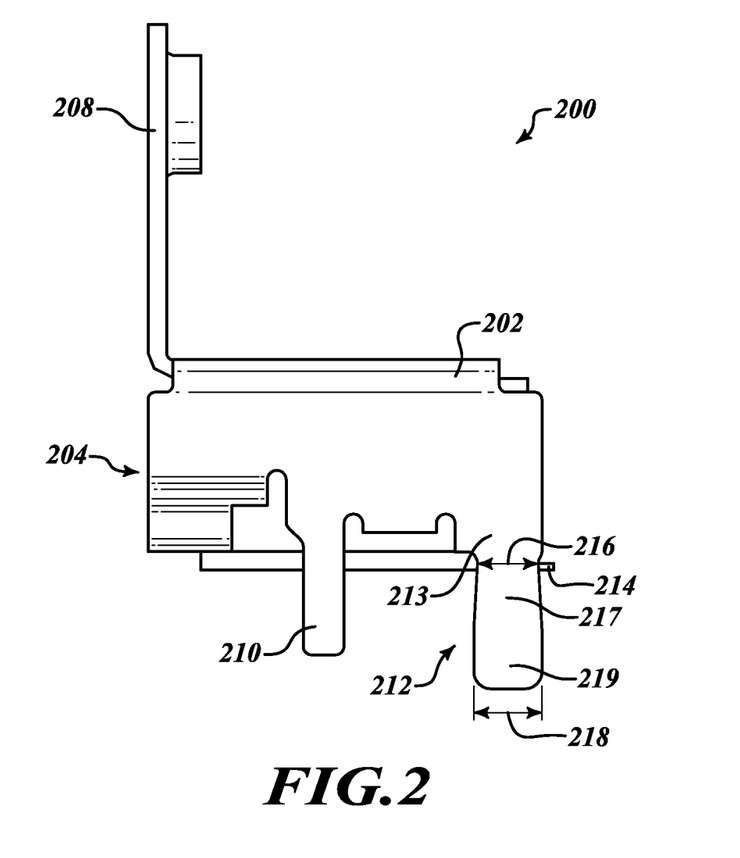
FIG. 2 is a side view of an HDMI panel flange signal connector with a reverse tapered mounting tab, according to one embodiment.

FIG. 2 is a side view of an HDMI panel flange signal connector with a reverse tapered mounting tab, according to one embodiment. The signal connector 200 includes a connector body 202 having an opening 204. The opening 204 exposes a port connector housed inside the connector body 202. A panel flange 208 extends from the connector body 202, preferably on a top side of the connector body 202. A first mounting tab 212 and a second mounting tab 210 extend from the connector body 202, preferably on a bottom side of the connector body 202. In other embodiments the signal connector 200 may not have a panel flange 208. Also, the signal connector 200 may have only one mounting tab. A surface contact line 214 is coupled to the connector body 202. The surface contact line 214 is electrically coupled to the port connector.

The first mounting tab 212 is a reverse tapered mechanical mounting tab. The first mounting tab 212 has a first section 213, a third section 219 and a second section 217 that is a middle section positioned between the first and third sections 213, 219, respectively. The reverse taper is shown with the first mounting tab 212 having a narrow second section 217 having a second width 216 and having a wide third section 219 having a third width 218. The second width 216 is measured at the most narrow region of the second section 217 of the first mounting tab 212. The second section 217 is adjacent to the first section 213 and the connector body 202. The third width 218 is measured at the widest point of the third section 219 of the first mounting tab 212 and is spaced away from the connector body 202. The second section 217, at its most narrow width, has a width that is less than the width of both the first section 213 and the third section 219. The first section 213 may be the same width as the third section 219. In some embodiments, the second section 217 may have a width that is slightly larger than the width of the first section 213. In one embodiment, the second mounting tab 210 has an approximately constant width, while in other embodiments it is tapered in a fashion similar to the taper of the first mounting tab 212.

FIG. 2 depicts a first side of the signal connector 200, with the first and second mounting tabs 212, 210. In one embodiment, a second side of the signal connector 200 opposite the first side may be a mirror image of the first side, including similarly sized and positioned mounting tabs. In another embodiment, the second side does not mirror the first side and may or may not include mounting tabs of various shapes and sizes.

Figure 3:
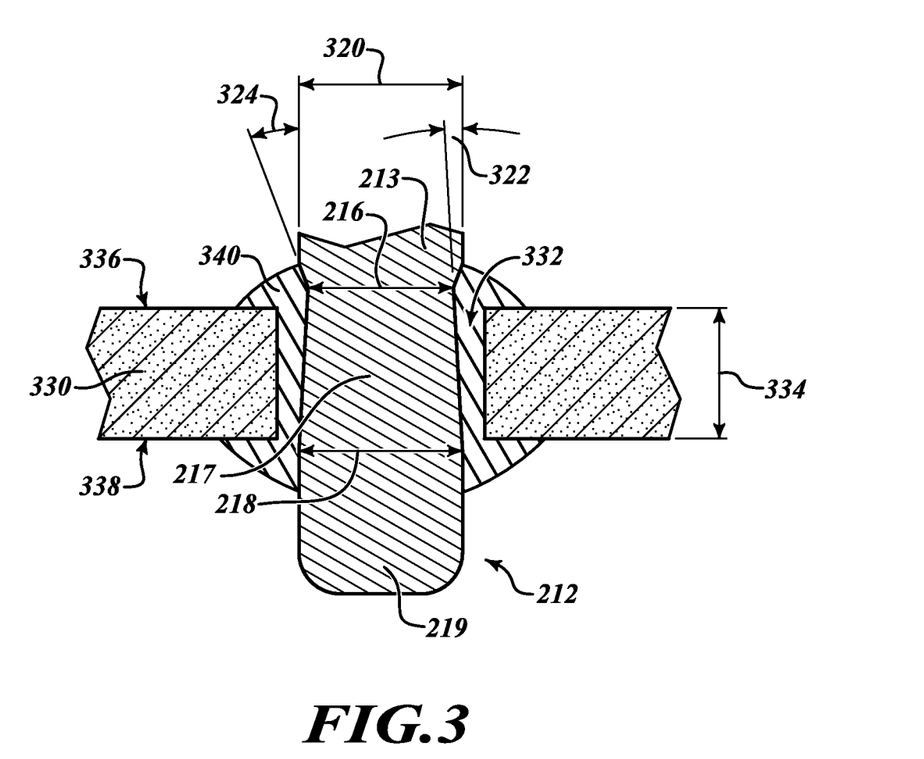
FIG. 3 is a diagrammatical side section view of the reverse tapered mounting tab positioned in a circuit board, according to one embodiment.

FIG. 3 is a diagrammatical side view of a reverse tapered mounting tab positioned in a circuit board, according to one embodiment. The first mounting tab 212 is positioned in a first through hole 332 of a circuit board 330. The circuit board has a thickness 334 between a top surface 336 and a bottom surface 338. The first mounting tab 212 is coupled to the circuit board 330 with a solder connection 340. The solder of solder connection 340 completely fills the first through hole 332 and extends above the top surface 336 and the bottom surface 338 of the circuit board 330.

The first mounting tab has a first section 213 above the second section 217, the first section 213 having with a first width 320 measured at the first section 213 of the first mounting tab 212 closer to the top surface 336 than the bottom surface 338 of the circuit board 330. The second width 216 is measured at the second section 217 of the first mounting tab 212 and is closer to the top surface 336 than the bottom surface 338 of the circuit board 330. The third width 218 is measured at the third section 219 of the first mounting tab 212 closer to the bottom surface 338 than the top surface 336 of the circuit board 330. The second width 216 of the first mounting tab 212 is smaller than both the first width 320 and the third width 218. The third width 218 and the first width 320 may be the same width or different widths.

In a preferred embodiment the solder connection 340 extends beyond the top surface 336 and the bottom surface 338 of the circuit board 330 to sufficiently cover the first mounting tab 212 such that the first, second and third sections are all completely encapsulated in the solder of solder connection 340.

In one embodiment, the thickness 334 of the circuit board 330 is approximately 1.6 millimeters and the second width 216 is measured at a point approximately 0.25 millimeters above the top surface 336 of the circuit board 330.

The first mounting tab 212 has a first width profile between the second width 216 and the first width 320 and a second width profile between the second width 216 and the third width 218. In a preferred embodiment, the first and second width profiles are approximately linear, meaning that the rate of change of the width is approximately constant. The degree of taper in the first width profile is a first taper angle 324. The degree of taper in the second width profile is a second taper angle 322. It is preferred that the first taper angle 324 is greater than the second taper angle 322. It is also preferred that the second width profile extends over a greater distance than the first width profile. The second width profile may extend over at least the entire thickness 334 of the circuit board 330, in one embodiment.

When the first mounting tab 212 is soldered in the through hole 332, the larger third width 218 of the third section 219 prevents the first mounting tab 212 from being forced out of the through hole 332. A constant width mounting tab would be more susceptible to being forced through as fatigue from heat and stress eventually deform or crack the solder connection 340. A minor deformation or crack may loosen the solder connection of the straight tab enough to release the tab. A reverse tapered tab, like the one shown in FIG. 3, would continue to hold the signal connector 200 in place after the occurrence of minor cracking and deformation. The larger width of the first mounting tab 212 at the third section 219 cannot be forced through the smaller width of the solder 340 at the second section 217, despite the solder of the solder connection 340 losing some or all of the surface friction against the first mounting tab 212. Also, the larger width of the first mounting tab 212 at the first section 213 cannot be forced through the smaller width of the solder 340 at the second section 217. Compression forces can hold the first mounting tab 212 in place when the surface friction coupling fails.

The first mounting tab 212 may also have a reverse taper in the thickness of the first mounting tab 212 in addition to or instead of reverse taper in the width of the first mounting tab 212. The thickness would be greater at the first and third sections 213, 219 of the first mounting tab 212 than at the second section 217 of the first mounting tab 212. The narrow second section 217 would be fixed into position by the solder connection 340 in the through hole 332 of the circuit board 330.

In a preferred embodiment the first mounting tab 212 is a ground line which couples the connector body 202 to a ground line of the circuit board 330. In an alternate embodiment, the first mounting tab 212 is a blade type signal line configured to transmit signals between a port connector in the connector body 202 and a signal line on the circuit board 330.

The reverse tapered first mounting tab 212 increases the durability of the interface between the signal connector 200 and the circuit board 330. As a mating connector is repeatedly inserted into and removed from the signal connector 200 on the circuit board 330, the first mounting tab 212 is subjected to mechanical stress. The stress may also come from the tension on a connector plugged into the signal connector 200. In addition, heat, either from the transmission through the signal connector 200 or from the circuit board 330, may cause fatigue in the solder connection 340. These and other factors will lead to degradation of the integrity of the solder connection 340.

As the solder connection 340 fatigues it may crack or deform. Because the first mounting tab 212 is shaped with a reverse taper, cracks and deformations will not cause the signal connector to be released from the circuit board 330. Any cavities created in the solder connection 340 will only allow slight movement in the first mounting tab 212 as the wider portion of the first mounting tab 212 will be forced into any slightly enlarged openings in the solder connection 340.

The same fatigue in the solder connection 340 is present when the solder connection 340 is enlarged due to stresses from repeated thermal expansion and contraction cycles. As the first mounting tab 212 creates cavities in the solder connection 340 due to heat cycles, the wider portions of the first mounting tab 212 will be forced into the slightly enlarged gap in the solder connection 340 as the first mounting tab 212 cools, allowing only limited movement and preventing the first mounting tab 212 from being released from the through hole 332 of the circuit board 330.

Because of the reverse taper, heat cycles also reposition the first mounting tab 212 into the correct location when cavities have developed in the solder connection 340. If cavities have developed and heat is applied, the first mounting tab 212 will attempt to expand. Because of the reverse taper shape, the first mounting tab 212 will be forced back to the most neutral point in which the narrowest point of the second section of the first mounting tab 212 is forced into the narrowest opening of the solder connection 340.

In addition, because the reverse taper of the first mounting tab 212 causes the first mounting tab 212 to force itself into contact with the solder connection 340, the electrical connection between the first mounting tab 212 and the solder connection 340 is maintained. The first mounting tab 212 may be the ground connection for the signal connector 200 in some embodiments to ensure that the ground voltage of the signal connector 200 does not float due to a bad ground connection. A floating ground voltage may lead to a high current short circuit, which may burn out a component, or may lead to a corrupted signal transmission that interferes with the signal transmitted through the signal connector 200. The ground connection may be from the circuit board 330 to the signal connector 200 through the first mounting tab 212 and the solder connections 340. The reverse tapered first mounting tab 212 may force itself into any cavities in the solder connection 340 from cracks or deformations to maintain a ground connection to the circuit board 330.

Figure 4A:
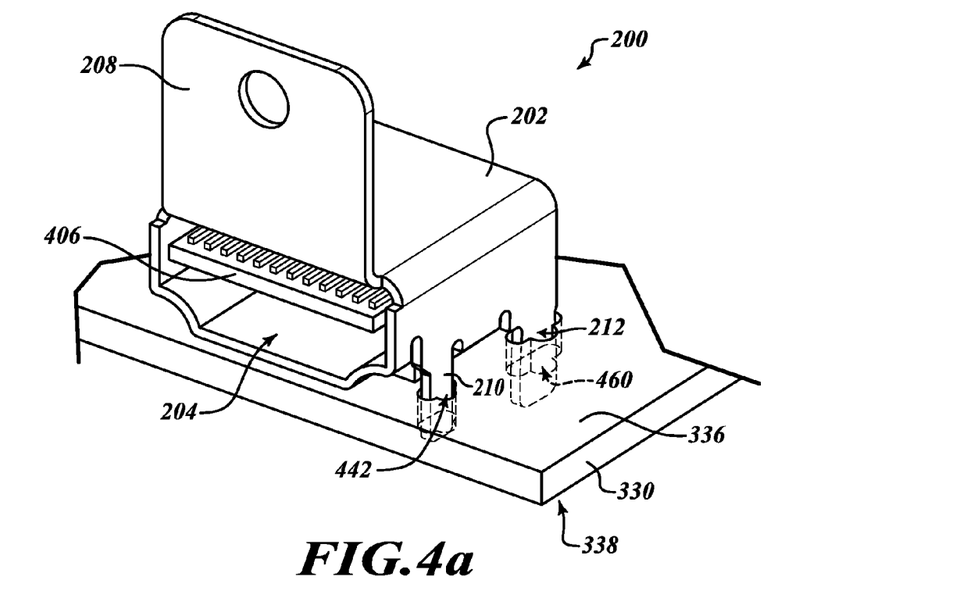
FIG. 4a is an isometric view of an HDMI panel flange signal connector with a reverse tapered mounting tab positioned on a circuit board, according to one embodiment.

FIG. 4a is an isometric view of an HDMI panel flange signal connector with a reverse tapered mounting tab positioned on a circuit board, according to one embodiment. The signal connector 200 has an opening 204 which exposes a port connector 406 housed inside the connector body 202. The signal connector 200 is positioned on a top surface 336 of a circuit board 330. The first mounting tab 212 extends through a first through hole 332 in the circuit board 330. The second mounting tab 210 extends through a second through hole 442 in the circuit board 330. The first and second mounting tabs 212, 210 extend beyond a bottom surface 338 of the circuit board 330. In a preferred embodiment, the first mounting tab 212 is a reverse tapered mechanical mounting tab as discussed above.

The first through hole 332 is used to secure the signal connector 200 to the circuit board 330. It may be preferred to minimize the clearance between the first mounting tab 212 and the through hole 332 to ensure that the signal connector 200 is correctly aligned. This results in tight clearances between the first mounting tab 212 and the first through hole 332 that may be hard to position solder into. The connection between the solder connection 340 and the first mounting tab 212 is strengthened by a sufficiently complete solder fill of the first through hole 332. As shown in FIG. 4a, the first through hole 332 may include a flow slot 460 that is a semi-cylindrical recess in the first through hole 332 running from the top surface 336 of the circuit board 330 to the bottom surface 338. The flow slot 460 provides a low resistance path for the solder to flow into the first through hole 332, while maintaining the narrow clearance between the first mounting tab 212 and the first through hole 332 at edges of a face of the first mounting tab 212. This and other designs for improved solder flow may be used with respect to any through holes on the circuit board 330.

The interface of the signal connector 200 to the circuit board 330 may benefit from increased overall durability. In one embodiment, the signal connector may experience an increased resistance to a first torque around a first axis through the first through hole 332, the first axis orthogonal to a face of the first mounting tab 212. In another embodiment, the signal connector may experience an increased resistance to a second torque around a second axis through the second through hole 442, the second axis being orthogonal to a face of the second mounting tab 210. For example, as a mating connector is repeatedly inserted into or removed from the signal connector 200, a force will be generated on the signal connector 200. The force vector may be approximately parallel to the top surface 336 of the circuit board 330 and approximately orthogonal to a face of the opening 204. Because this force is generated at a distance from, and not in line with, the through holes 332, 442, a torque will be generated.

When a force is generated against the connector body 202 pointing towards a rear side of the signal connector 200 (e.g., inserting a mating connector into the connector body 202), a torque will be generated in the first mounting tab 212 and the signal connector will attempt to rotate around the first axis because the mounting tabs cannot be forced towards the front side of the signal connector 200 due to the mounting tabs 212, 210 being in the through holes 332, 442, respectively. The first torque around the first axis may be resisted primarily at the panel flange 208 with the aid of the second mounting tab 210. In an alternate embodiment, the first torque creates a tension force on the second mounting tab 212 that is resisted by the reverse taper of a mounting tab in the second through hole 442.

When a force is generated against the connector body 202 and pointing towards a front side of the signal connector 200 (e.g., removing a mating connector from the connector body 202), a torque will be generated in the second mounting tab 210 and the signal connector 200 will attempt to rotate around the second axis because the mounting tabs cannot be forced towards the front side of the signal connector 200 due to the mounting tabs 212, 210 being in the through holes 332, 442, respectively. The second torque around the second axis may be resisted primarily by the first mounting tab 212. The addition of a reverse taper in the first mounting tab 212 provides the signal connector 200 with an increased resistance to the second torque. The second torque creates a tension force on the first mounting tab 212 that is resisted by the reverse taper of the first mounting tab 212 in the solder connection 340.

Figure 4B:
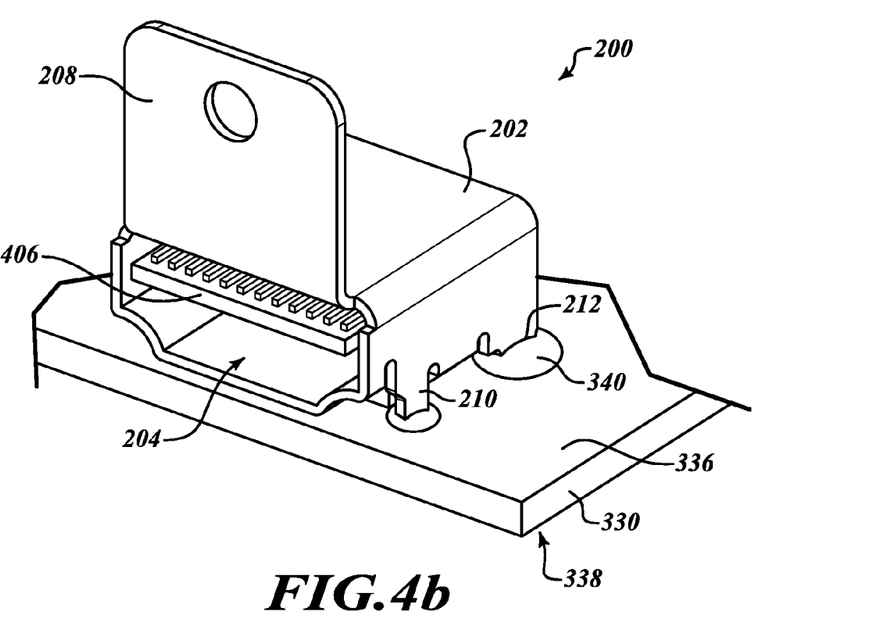
FIG. 4b is an isometric view of the HDMI panel flange signal connector of FIG. 4a with solder covering the reverse tapered mounting tab.

FIG. 4b is an isometric view of the HDMI panel flange signal connector of FIG. 4a with solder covering the mounting tabs. The signal connector 200 is shown mounted to the circuit board 330 by a solder connection 340. The solder connection 340 is positioned in the first through hole 332 such that solder emerges from both the top surface 336 and the bottom surface 338 of the circuit board 330. The solder connection 340 encapsulates the second section of the first mounting tab 212. Solder may also secure the second mounting tab 210 in the second through hole 442.

In one embodiment, the solder connection 340 completely encapsulates the first mounting tab 212. In another embodiment, the solder connection 340 covers all of the second section 217, and part of the first and third sections, 213, 219. Solder may also cover all or part of the second mounting tab 210. In one embodiment the first and second mounting tabs 212, 210 are secured to the circuit board 330 with individual solder connections. In a further embodiment, the first and second mounting tabs 212, 210 are secured to the circuit board 330 with a single solder connection.

As shown, the signal connector 200 is preferably mounted on an edge of the circuit board 330. However, the signal connector 200 may also be mounted on an interior location of the circuit board 330.

Figure 5:
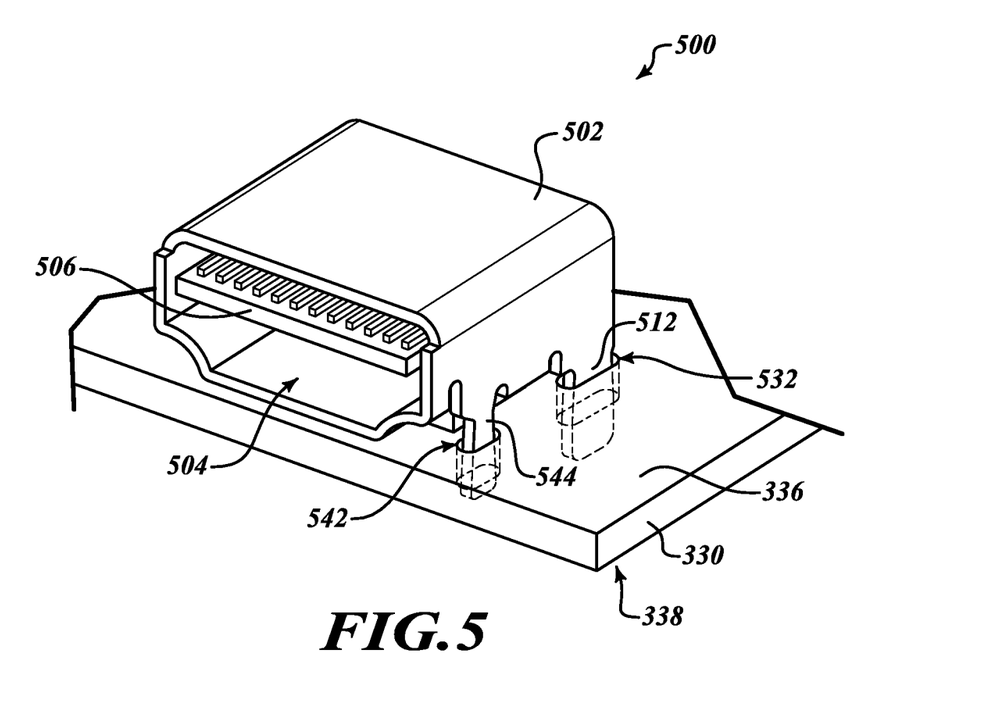
FIG. 5 is an isometric view of an HDMI port connector with two reverse tapered mounting tabs positioned on a circuit board, according to one embodiment.

FIG. 5 is an isometric view of an HDMI port connector with two reverse tapered mounting tabs positioned on a circuit board, according to one embodiment. The signal connector 500 includes a connector body 502 having an opening 504. The opening 504 exposes a port connector 506 housed inside the connector body 502. A first mounting tab 512 and a second mounting tab 544 extend from the connector body 502, preferably on a bottom side of the connector body 502. The signal connector 500 is positioned on a top surface 336 of a circuit board 330. The first mounting tab 512 extends through a first through hole 532 in the circuit board 330. The second mounting tab 544 extends through a second through hole 542. The first and second mounting tabs 512, 544 may extend beyond a bottom surface 338 of the circuit board 330.

Both the first mounting tab 512 and the second mounting tab 544 are reverse tapered mechanical mounting tabs. The reverse taper of the first mounting tab 512 and the second mounting tab 544 is similar to the taper described with respect to the first mounting tab 212 of FIG. 2. This embodiment experiences a similar resistance to a second torque around a second axis through the second through hole 542, the second axis orthogonal to a face of the second mounting tab 544. The use of a reverse tapered second mounting tab 544 improves durability of the interface between the signal connector 500 and the circuit board 330 by increased resistance to a first torque around a first axis through the first through hole 532 and orthogonal to a face of the first mounting tab 512. The first torque creates a tension force on the second mounting tab 544 that is resisted by the reverse taper of the second mounting tab 544 in the second through hole 542.

In one embodiment, the two reverse tapered mounting tabs 512, 544 may be used on a signal connector without a panel flange. In another embodiment the two reverse tapered mounting tabs 512, 544 may be used in conjunction with a signal connector having a panel flange. In a further embodiment, a signal connector may include only one reverse tapered mounting tab, but neither a second reversed tapered mounting tab nor a panel flange.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a connector body;
   a port connector inside the connector body; and
   a first mounting tab having:
      a first section extending from the connector body, the first section having a first width;
      a second section extending from the first section, the second section having a second width; and
      a third section extending from the second section, the third section having a third width, the second width being less than the first and third widths.

2. The device of claim 1, further comprising:
   a first intermediate width profile of the first mounting tab between the first section and the second section having a first approximately linear taper.

3. The device of claim 2, further comprising:
   a second intermediate width profile of the first mounting tab between the second section and the third section having a second approximately linear taper, the first intermediate approximately linear taper being steeper than the second approximately linear taper.

4. The device of claim 1, wherein the first mounting tab is a ground reference line for the port connector.

5. The device of claim 1, wherein the first mounting tab is a signal line for the port connector.

6. The device of claim 1, further comprising:
   a surface contact line electrically coupled to the port connector and mechanically coupled to the connector body, the surface contact line being a surface mount connector configured to be coupled to a circuit board.

7. The device of claim 1, wherein the port connector is an HDMI port connector or USB port connector.

8. The device of claim 1, wherein the first mounting tab is made at least in part from tin or nickel.

9. A circuit, comprising:
   a circuit board having a through hole;
   a signal connector including:
      a connector body;
      a port connector inside the connector body; and
      a first mounting tab extending from the connector body as a unitary and integral part thereof, the first mounting tab positioned in the through hole, the first mounting tab having:
         a first section extending from the connector body, the first section having a first width;
         a second section extending from the first section, the second section having a second width; and
         a third section extending from the second section, the third section having a third width, the second width being less than the first and third widths.

10. The circuit of claim 9, wherein the circuit board has a top surface and a bottom surface, the first section being positioned closer to the top surface than the bottom surface of the circuit board, and the third section being positioned closer to the bottom surface than the top surface of the circuit board.

11. The circuit of claim 10, wherein the second section is positioned closer to the top surface than the bottom surface of the circuit board.

12. The circuit of claim 10, wherein the first and third sections are not positioned between the top surface and the bottom surface of the circuit board.

13. The circuit of claim 9, wherein the port connector is an HDMI port connector or USB port connector.

14. The circuit of claim 9, further comprising:
   a solder connection, the solder connection positioned in the through hole and mechanically coupled to the circuit board and the signal connector.

15. The circuit of claim 14, wherein the solder connection extends above a top surface of the circuit board and below a bottom surface of the circuit board opposite the top surface, the solder connection covering the first, second and third sections of the first mounting tab.

16. The circuit of claim 9, wherein the first mounting tab is a ground reference line for the port connector.

17. The circuit of claim 9, wherein the first mounting tab is a signal line for the port connector.

18. The circuit of claim 9, further comprising:
   a surface contact line electrically coupled to the port connector and mechanically coupled to the connector body, the surface contact line further coupled to the circuit board.

19. The circuit of claim 9, further comprising:
   a second mounting tab that is smaller than the first mounting tab, the second mounting tab having:
      a fourth section extending from the connector body, the fourth section having a fourth width;
      a fifth section extending from the fourth section, the fifth section having a fifth width; and
      a sixth section extending from the fifth section, the sixth section having a sixth width, the fifth width being less than the fourth and sixth widths.

20. The circuit of claim 9, wherein the first mounting tab is made at least in part from tin or nickel.

21. A device, comprising:
   a connector body;
   a port connector inside the connector body;
   a first mounting tab having:
      a first section extending from the connector body, the first section having a first width;
      a second section extending from the first section, the second section having a second width; and
      a third section extending from the second section, the third section having a third width, the second width being less than the first and third widths; and a second mounting tab that is smaller than the first mounting tab, the second mounting tab having:
- a fourth section extending from the connector body, the fourth section having a fourth width;
- a fifth section extending from the fourth section, the fifth section having a fifth width; and
- a sixth section extending from the fifth section, the sixth section having a sixth width, the fifth width being less than the fourth and sixth widths.

\* \* \* \* \*